(12) United States Patent
Bordignon et al.

(10) Patent No.: US 12,088,328 B1
(45) Date of Patent: Sep. 10, 2024

(54) REDUCING THE COMPRESSION ERROR OF LOSSY COMPRESSED SENSOR DATA

(71) Applicant: Dell Products L.P., Round Rock, TX (US)

(72) Inventors: Alex Laier Bordignon, Niterói (BR); Franklin Jordan Ventura Quico, Niterói (BR); Rômulo Teixeira de Abreu Pinho, Niterói (BR); Vinicius Michel Gottin, Rio de Janeiro (BR); Paulo de Figueiredo Pires, Niterói (BR)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 18/361,248

(22) Filed: Jul. 28, 2023

(51) Int. Cl.
- *H03M 7/30* (2006.01)
- *G06N 3/08* (2023.01)
- *H03M 13/00* (2006.01)

(52) U.S. Cl.
CPC ............ *H03M 7/6041* (2013.01); *G06N 3/08* (2013.01); *H03M 7/3059* (2013.01); *H03M 13/612* (2013.01)

(58) Field of Classification Search
CPC ............ H04N 19/91; G06N 3/02; G06N 5/02; G06N 5/047; G06N 20/00; G06N 3/08; G06F 18/00; G06F 16/1744; H03M 7/30; H03M 7/3059; H03M 7/3082
See application file for complete search history.

(56) References Cited

U.S. PATENT DOCUMENTS

2020/0293527 A1* 9/2020 Srivastav .............. G06F 16/285

OTHER PUBLICATIONS

J. Lin, E. Keogh, L. Wei and S. Lonardi, "Experiencing SAX: a novel symbolic represenation of time series," 2007.
J. Lin, E. Keogh, S. Lonardi and B. Chiu, "A Symbolic Representation of Time Series, with Implications for Streaming Algorithms," DMKD Journal, 2007.
N. Ruta, N. Sawada, K. McKeough, M. Behrisch and J. Beyer, "Sax navigator: Time series exploration through hierarchical clustering," 2019 IEEE Visualization Conference.
E. Keogh, "SAX homepage," [Online]. Available: https://www.cs.ucr.edu/. [Accessed Dec. 14, 2022].

* cited by examiner

*Primary Examiner* — Hau H Hoang
(74) *Attorney, Agent, or Firm* — Workman Nydegger

(57) ABSTRACT

Reconstructing compressed data to reduce compression loss. Data at a device is compressed using lossy compression and metadata values are added to the compressed data. A gateway receives a package including the compressed data and the metadata values. The data is decompressed and input to a machine learning model along with the metadata values. The machine learning model is trained to reduce the compression loss. The output of the model is an improved decompressed data. Actions may be performed based on the improved decompressed data.

20 Claims, 8 Drawing Sheets

Compress Ratio 10%

| Dataset | PSNR Baseline | PSNR No Sax | PSNR SAX Ws=1 Bins=3 | PSNR SAX Ws=1 Bins=7 | PSNR SAX Ws=1 Bins=11 | PSNR SAX Ws=3 Bins=3 | PSNR SAX Ws=3 Bins=7 | PSNR SAX Ws=3 Bins=11 | PSNR SAX Ws=5 Bins=3 | PSNR SAX Ws=5 Bins=7 | PSNR SAX Ws=5 Bins=11 |
|---|---|---|---|---|---|---|---|---|---|---|---|
| 1 | 35.74 | 35.64 | 34.90 | 43.0 | 48.1 | 34.36 | 36.98 | 37.19 | 34.56 | 34.67 | 34.87 |
| 2 | 12.64 | 8.64 | 13.52 | 20.7 | 22.1 | 8.59 | 16.90 | 18.48 | 3.20 | 12.30 | 11.99 |
| 3 | -0.38 | -0.43 | 4.31 | 29.8 | 36.9 | -0.52 | 0.92 | 1.44 | -0.52 | -0.27 | 0.40 |
| 4 | 20.48 | 45.24 | 46.32 | 48.0 | 50.7 | 44.69 | 47.78 | 43.56 | 43.73 | 43.65 | 44.36 |
| 5 | 1.71 | 1.78 | 21.13 | 51.3 | 62.7 | 2.50 | 7.38 | 5.93 | 1.73 | 2.26 | 2.14 |
| 6 | -2.81 | -1.78 | 40.28 | 13.0 | 19.4 | -4.46 | -8.02 | -8.11 | -10.20 | -9.97 | -10.11 |
| 7 | 25.43 | 8.15 | 8.57 | 24.0 | 25.8 | 15.57 | 24.14 | 25.33 | 14.41 | 23.48 | 22.16 |
| 8 | 47.68 | 48.01 | 12.62 | 54.8 | 60.3 | 19.04 | 53.24 | 55.70 | 25.13 | 49.55 | 56.15 |
| 9 | -8.12 | -14.63 | 11.45 | 6.5 | 4.5 | -21.00 | -25.61 | -19.39 | -12.10 | -17.48 | -15.27 |
| 10 | 15.37 | 11.38 | 38.39 | 37.4 | 32.3 | 25.83 | 4.26 | 12.72 | 12.48 | 16.12 | 15.42 |
| 11 | 42.66 | 42.64 | 42.78 | 55.0 | 59.0 | 42.57 | 43.43 | 44.75 | 42.43 | 42.53 | 43.14 |
| 12 | 24.21 | 24.19 | 24.73 | 36.7 | 62.5 | 21.80 | 24.61 | 26.38 | 24.10 | 23.89 | 24.89 |
| 13 | 20.26 | 20.39 | 20.20 | 36.1 | 43.2 | 18.46 | 23.60 | 25.00 | 19.45 | 21.25 | 22.49 |
| Average | 18.07 | 17.63 | 24.55 | 35.10 | 40.38 | 15.96 | 19.20 | 20.69 | 15.26 | 18.61 | 19.43 |

Compress Ratio 20%

| DATASET | PSNR BASE | PSNR No SAX | PSNR SAX Ws=1 Bins=3 | PSNR SAX Ws=1 Bins=7 | PSNR SAX Ws=1 Bins=11 | PSNR SAX Ws=3 Bins=3 | PSNR SAX Ws=3 Bins=7 | PSNR SAX Ws=3 Bins=11 | PSNR SAX Ws=5 Bins=3 | PSNR SAX Ws=5 Bins=7 | PSNR SAX Ws=5 Bins=11 |
|---|---|---|---|---|---|---|---|---|---|---|---|
| 1 | 38.68 | 37.84 | 38.02 | 45.8 | 50.6 | 38.58 | 38.06 | 38.90 | 37.41 | 36.63 | 36.77 |
| 2 | 24.17 | 18.01 | 16.44 | 26.7 | 27.0 | 15.42 | 15.55 | 20.14 | 9.80 | 15.70 | 16.39 |
| 3 | 0.35 | 0.19 | 4.71 | 30.8 | 37.1 | 0.29 | 1.97 | 2.72 | 0.29 | -0.02 | 1.01 |
| 4 | 40.08 | 71.14 | 75.22 | 65.8 | 65.8 | 71.99 | 72.20 | 68.41 | 67.25 | 78.11 | 70.73 |
| 5 | 2.09 | 2.10 | 19.92 | 52.4 | 63.0 | 2.62 | 8.71 | 8.30 | 2.13 | 2.21 | 2.68 |
| 6 | -1.64 | 31.10 | 52.76 | 26.7 | 24.3 | 16.43 | 9.25 | 17.23 | -13.10 | -6.60 | -6.06 |
| 7 | 26.60 | 22.07 | 25.74 | 32.0 | 34.2 | 12.22 | 25.93 | 20.53 | 16.05 | 24.00 | 24.89 |
| 8 | 61.71 | 60.53 | 22.09 | 63.6 | 67.2 | 23.55 | 62.50 | 61.68 | 26.78 | 60.67 | 58.01 |
| 9 | -6.97 | 15.54 | 7.52 | 12.3 | 6.7 | -9.75 | 0.71 | 0.20 | -9.56 | -6.99 | 2.98 |
| 10 | 16.51 | 33.66 | 52.82 | 41.1 | 35.1 | 20.78 | 26.46 | 26.91 | 19.50 | 21.91 | 32.89 |
| 11 | 44.09 | 44.09 | 44.08 | 56.3 | 60.0 | 44.08 | 44.70 | 45.53 | 43.96 | 44.12 | 44.12 |
| 12 | 25.49 | 25.49 | 27.01 | 37.8 | 63.0 | 20.99 | 25.68 | 26.90 | 25.24 | 25.45 | 25.81 |
| 13 | 23.58 | 23.53 | 21.68 | 38.6 | 44.7 | 21.47 | 25.27 | 25.83 | 21.95 | 23.84 | 23.48 |
| Average | 22.67 | 29.64 | 31.39 | 40.76 | 44.52 | 21.44 | 27.46 | 27.94 | 19.05 | 24.54 | 25.67 |

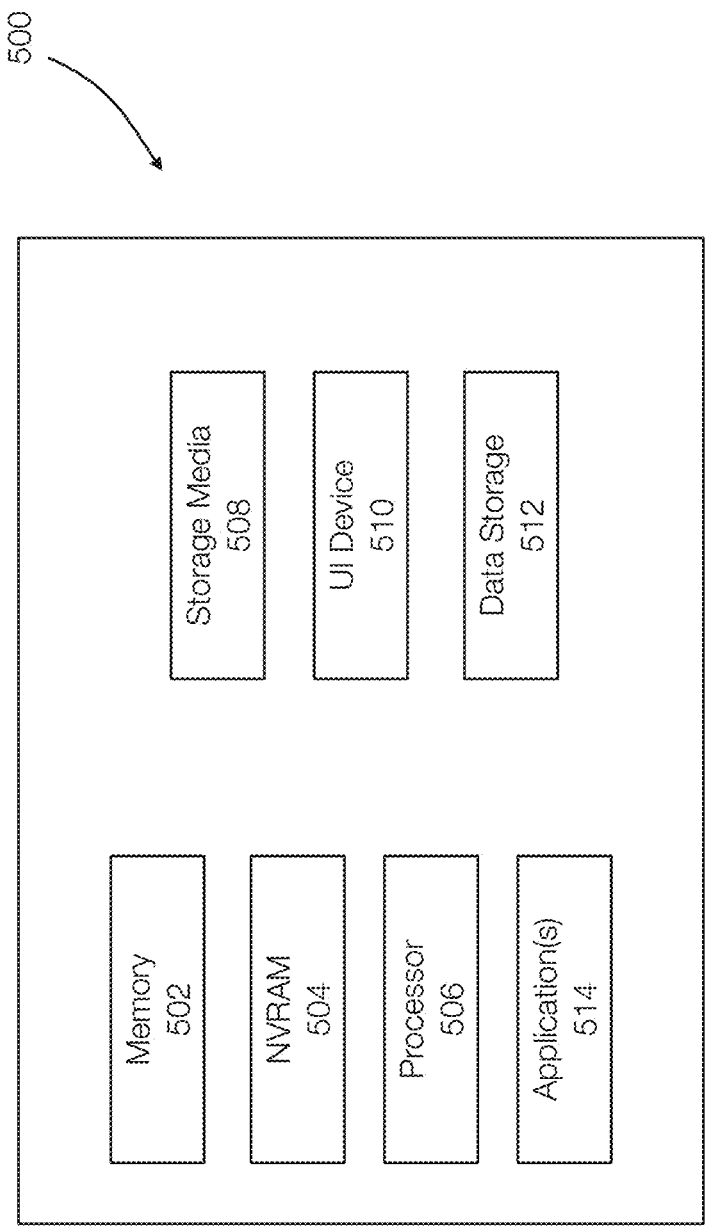

REDUCING THE COMPRESSION ERROR OF LOSSY COMPRESSED SENSOR DATA

FIELD OF THE INVENTION

Embodiments of the present invention generally relate to reconstructing compressed data. More particularly, at least some embodiments of the invention relate to systems, hardware, software, computer-readable media, and methods for reducing compression error in lossy compressed data.

BACKGROUND

The Internet of Things (IOT) generally relates to anything connected to a network such as the Internet. IoT things include objects, sensors, cameras, smart devices, software, or the like that are able to communicate and/or transmit data over a network and are generally referred to herein as devices.

Many of these devices may be configured to perform specific tasks. Weather related sensors, for example, may collect weather related data such as wind speed, temperature, humidity, or the like. The data collected while performing these tasks is transmitted to a target, such as a gateway or server. One of the difficulties faced by these devices is that processing/transmitting operations performed at the device require power and the power available to these devices may be limited.

Some devices are configured to balance the power required to process the data and the power required to transmit the data. Power expended in transmitting data can be reduced by reducing the amount of data to be transmitted. Reducing the amount of data to be transmitted, however, may require processing operations, such as compression, to be performed. Performing compression operations, however, consumes power. To manage power consumption, many devices may perform a simple lossy compression algorithm. Simple compression operations can be performed quickly, consume little power, and have high compression ratios. As a result, the overall power consumption is reduced. One consequence, however, is that some data is lost.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings, in which:

FIGS. 4A, 4B, and 4C discloses aspects of experiments related to reconstructing compressed data; and FIG. 5 discloses aspects of an example computing device, system, or entity.

DETAILED DESCRIPTION OF SOME EXAMPLE EMBODIMENTS

Embodiments of the present invention generally relate to reconstructing lossy compressed data. More particularly, at least some embodiments of the invention relate to systems, hardware, software, computer-readable media, and methods for reducing the compression error of data that has been compressed using lossy compression operations.

Embodiments of the invention are discussed in the context of IoT devices configured to send data to a target, such as a gateway, a server, the cloud, or the like. Embodiments of the invention may be used in any device, system, or environment in which lossy compression is employed.

With the increasing use of IoT devices, such as smart devices (e.g., smart sensors), there is corresponding need to collect the ever increasing amount of data generated or collected by these devices. As previously stated, transmitting this data is problematic due to resource (e.g., power) and network constraints. Consequently, the data is compressed at the devices using lossy compression techniques, which may be associated with higher compression rates compared to lossless compression techniques.

Embodiments of the invention are discussed with respect to compressed data. However, the data may represent continuous signals, univariate or multivariate time series data, signal samples, or the like.

The compression algorithms used in IoT devices may be configured to be energy efficient and, as a result, the compressed data may still contain patterns and repetitions that are not leveraged by the compression algorithm. For example, a simple algorithm may compress the data but may not remove all data redundancies.

Figure 1A:
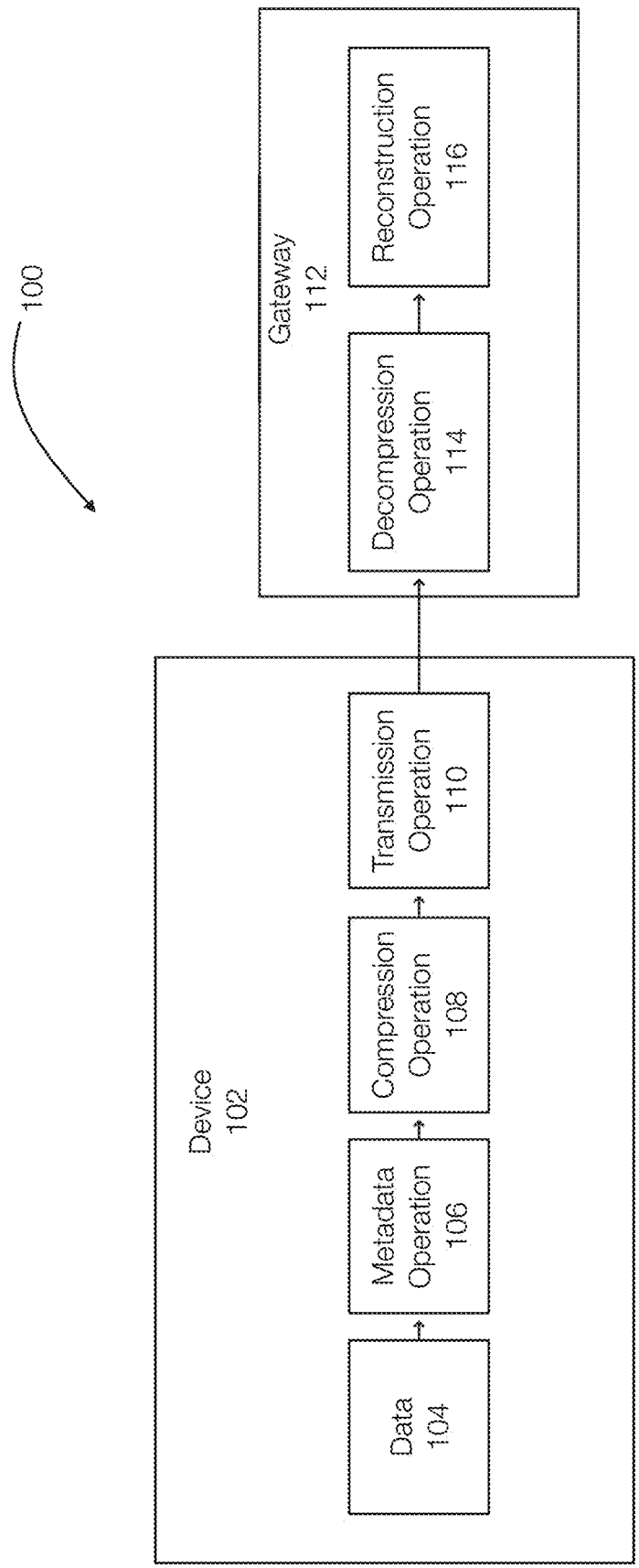
FIG. 1A discloses aspects of a system in which compressed data is reconstructed.

FIG. 1A discloses aspects of a system or environment in which compressed data is reconstructed. The system 100 is represented by a device 102 that is associated with a gateway 112. The device 102 may include a controller, processor, memory or other circuitry that is configured to at least perform compression operations, metadata operations, and transmission operations. The device 102 may be a sensor or other object configured to collect, measure, sense, and/or generate data 104. The device 102 may be configured to record and transmit the readings of an instrument. Once the data 104 measured, read, collected, or the like, a metadata operation 106 may be performed. A compression operation 108 is performed and the metadata may be added, appended, or associated to the compressed data. The compressed data (and metadata) is then transmitted to the gateway 112 in a transmission operation 110.

The gateway 112, upon receiving data transmitted by the device 102, may perform a decompression operation 114 and a reconstruction operation 116. The reconstruction operation may include improving the quality of the decompressed data generated by the decompression operation 114. Stated differently, the reconstruction operation 116 may reduce the compression error present in the decompressed data. During reconstruction, a machine learning model that has been trained to reduce compression error can improve the quality of the decompressed data. The gateway 112 may be a server, an edge system, a cloud system, or the like. The gateway 112 may include a processor, memory, or the like and is configured to reconstruct compressed data received from the device 102. The gateway 112 may be associated with multiple devices of the same and/or different types.

Some applications may desire to perform queries in the compressed data. This may be achieved, by way of example, when symbolic aggregate approximation (SAX) is employed. SAX is an example of adding or appending metadata to compressed data.

Figure 4A:
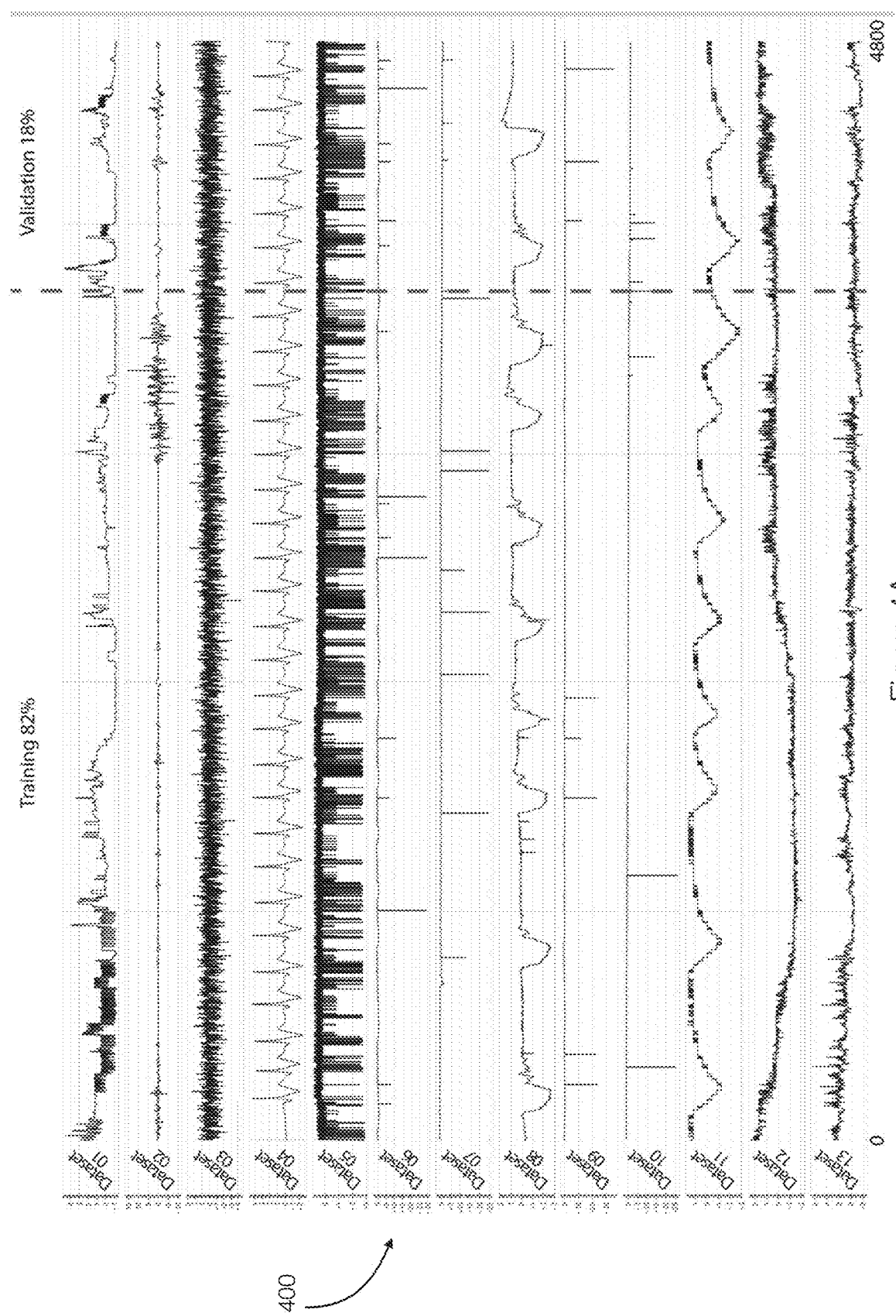

More specifically, embodiments of the invention improve the quality of the reconstructed signals using, in one example, SAX metadata or values without increasing the complexity or energy expenditure of the IoT device 102. A machine learning model (e.g., a neural network) can be trained to learn the patterns of the compression algorithm along with the SAX metadata, which can then be applied to reduce compression errors during the decompression step in the gateway. This can result in a significant improvement in signal quality, as demonstrated by experiments performed on a variety of lossy compressed data and as illustrated in FIGS. 4A-4C.

In general, embodiments of the invention receive lossy compressed data and metadata (e.g., SAX metadata or values) from an IoT device and apply a machine learning architecture, which is trained to use the decompressed data and/or metadata to reduce the compression error. This machine learning model is applied, in one embodiment, only in the decompression or reconstruction operation 116 at the gateway 112. Advantageously, higher energy expenditure at the device 102 is not induced while using patterns in the compressed data, the decompressed data and/or the metadata to decrease the compression error in the decompressed data. The machine learning model is capable of exploiting patterns that the compression algorithms at the IoT devices does not exploit.

Upon arrival at the gateway 112, the compressed data may be decompressed with some loss of quality (the compression error_. The decompressed data is passed through or input to a trained machine learning model that has learned the patterns of the compression algorithm in conjunction with the metadata. This allows compression losses or errors to be reduced.

In one example, compression algorithms typically make the same mistakes or compression decisions in the same cases. The machine learning model is able to learn the cases or scenarios in which mistakes are made and correct those mistakes or inefficient compression decisions, thereby improving the quality of the decompressed data or signal.

Embodiments of the invention improve the quality of decompressed data without increasing the number of bits transmitted by the device 102. This improves sensor telemetry without consuming more power (e.g., battery power). The complexity and energy expenditure of the device 102 is not increased as processing related to reducing the compression error is performed at the gateway.

Embodiments of the invention can be applied to multiple lossy compression algorithms and can explore/learn the patterns of both the compressed data and the metadata.

Embodiments of the invention operate by using the processing power of the gateway to improve the quality of the lossy compressed data received from the device 102, thereby reducing bandwidth costs and conserving the device's battery or power source, as the device 102 can send the same number of bits while embodiments of the invention improve the quality of the reconstructed data.

In one example, the machine learning model may include a multilayer perceptron (MLP) or other neural network. An MLP typically includes at least three layers of nodes: an input layer, a hidden layer, and an output layer. Each node in the hidden and output layers may use a nonlinear activation function. MLP networks are trained using a supervised learning technique of backpropagation.

Figure 1B:
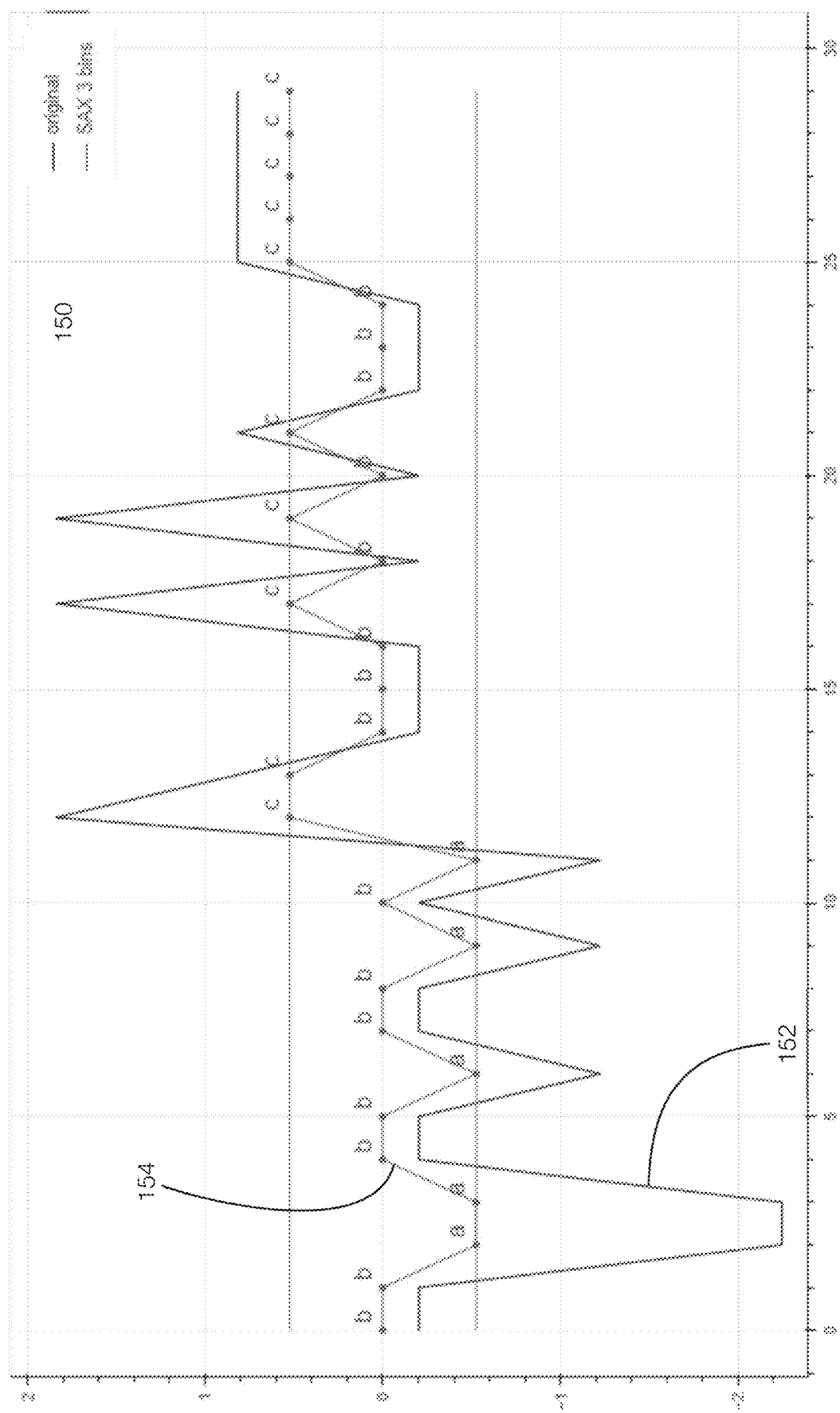
FIG. 1B discloses aspects of symbolic aggregate approximation.

FIG. 1B discloses aspects of metadata that may be appended to compressed data. More specifically, FIG. 1B discloses aspects of symbolic aggregate approximation (SAX) metadata. FIG. 1B illustrates a graph 150 of a signal 100 (e.g., a univariate time series) that may be generated at a device. The graph 150 illustrates an example of time series data with the value of the data represented in the y-axis and time represented in the x-axis.

In this example, the original signal 152 is represented in the graph 150. In this example, the continuous time series may be binned into intervals. For example, a sample may be taken each second. In this example, each sample (or each window) includes a single sample. Metadata (e.g., SAX values) is applied by converting each sample into a symbol.

In this example, values of the signal 152 between 0.5 and −0.5 are given a symbol of b. Values of the signal 152 less than −0.5 are given a symbol of a. Values of the signal 152 greater than 0.5 are given a symbol of c.

The metadata or symbolic representation 154 is a series of symbols or values (e.g., bbaabbabbabaccbbbcbcb-cbbbccccc). The symbolic representation 154 is highly compressible and allows patterns in the original data or signal 152 to be identified or found without looking at the complete original signal 152. The SAX metadata 154 can be stored and searched.

FIG. 1B also illustrates that there is a distinction between bins and windows. If a sample is taken during a particular window, that sample may be binned into one of n bins. In this example, there are three bins (a, b, and c) and each sample in each window is associated with one of these bins.

Figure 2A:
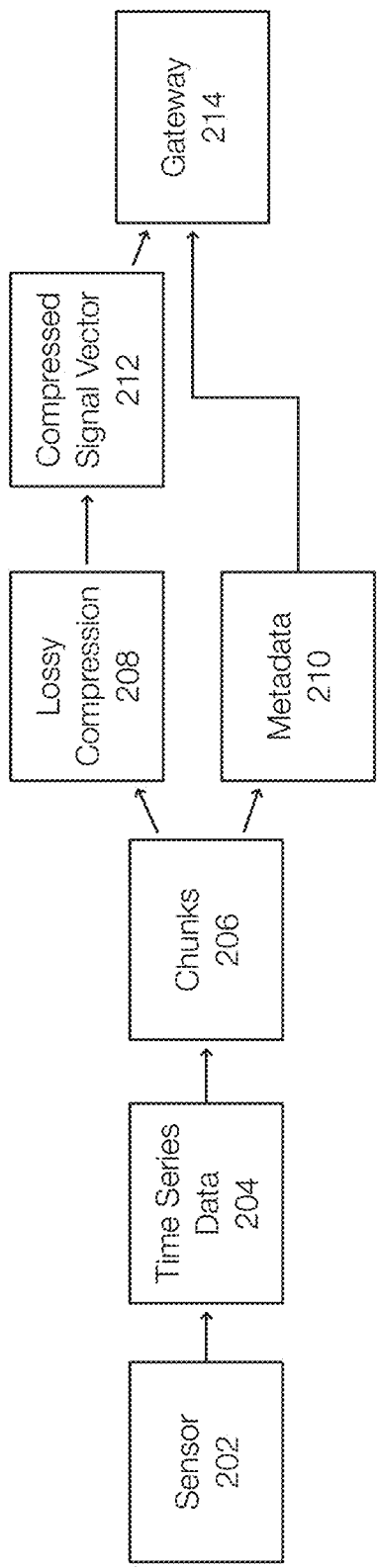
FIGS. 2A and 2B disclose aspects of reconstructing data that has been compressed to reduce compression error.

FIG. 2A discloses aspects of transmitting data from an IoT device to a gateway or target. In FIG. 2A, a sensor 202 may be configured to collect/measure/generate data (or a signal). The data may be represented as time series data 204. The time series data 204 may be chunked into chunks 206 or intervals. Chunking the data may allow data to be sent more regularly and timelier.

More specifically, data collected from IoT devices, such as the sensor 202, may include univariate or multivariate time series. The sensor 202 may capture samples $X=[X_1, X_2, \ldots, X_{nsamples}]$. The number of samples is nsamples. Prior to transmitting these samples to a gateway, the sequence may be broken into small chunks of size n, $X^i=X_1^i, X_2^i, \ldots, X_n^i$. Each chunk $X^i$ will be processed and transmitted individually in one example. Depending on a tolerated latency, n may be small (e.g., sized from 8 to 32 samples).

In one example, the sensor 202 may compress the chunk array $X^i$. The compression may be an algorithm that reduces the size of the data and generates a new approximate representation of the chunk array. In one example, the new sequence of values is represented as $K^i=K_1^i, K_2^i, \ldots, K_n^i$. Compression may be performed using a discrete cosine transform (DCT). If DCT is used during compression, the sequence may represent the coefficients of the DCT. The sequence K' is transmitted to the gateway.

Thus, lossy compression 208 (DCT) is performed on the chunks 206 to generate a compressed signal vector 212, which is transmitted to the gateway 214. In one example, metadata (e.g., SAX symbols) are determined for the chunk X'. The SAX values are represented as $S^i=S_1^i, S_2^i, \ldots, S_n^i$. If one SAX value is used for each sample, then nsax=n.

The values of $S_1^i, S_2^i, \ldots, S_n^i$ depend on the number of bins. If there are three bins, the possible values are a, b, and c. If there are 5 bins, the possible values are a, b, c, d, and e. The SAX values $S^i$ are also transmitted to the gateway

214. Thus, in one example, a package including the compressed data (compressed data vector) and associated metadata (SAX values) are transmitted to the gateway 214.

More specifically, in addition to compressing (208) the data or chunks, a metadata operation is performed to add or append metadata 210, such as SAX values. The metadata can also be compressed (usually in a lossless manner).

FIG. 2A illustrates that the lossy compression 208 and the metadata computation 210 are performed separately and/or independently and then transmitted to the gateway 214.

Figure 2B:
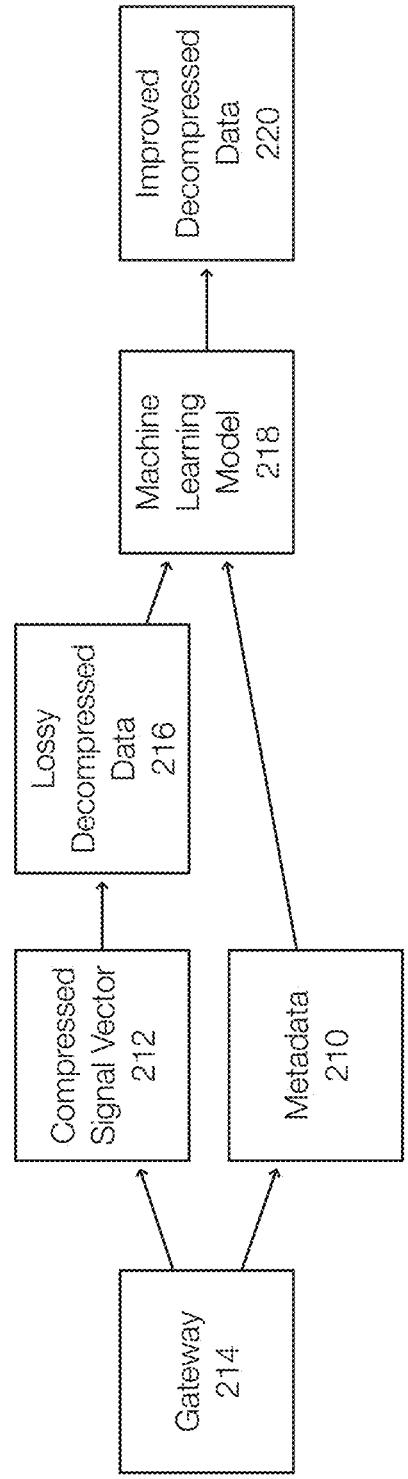

FIG. 2B discloses aspects of reconstructing compressed data to reduce compression error. In FIG. 2B, the compressed signal vector 212 and metadata 210 have been transmitted to and received by a gateway 214. The gateway may decompress the compressed signal vector 212 to generate lossy compressed data 216. The lossy decompressed data 216 and the metadata 210 are input to a machine learning model 218, which outputs improved decompressed data 220.

More specifically, the sequences $S^i$ (metadata) and $K^i$ (compressed data) arrive at the gateway 214. The compression process is reversed to generate an approximation $(\check{X}^i = \check{X}_1^i, \check{X}_2^i, \ldots, \check{X}_n^i)$ of the original data. Thus, $\check{X}^i$ is the lossy uncompressed chunk. The compression error can be expressed as a distance between the original data and the lossy uncompressed data: compression error=$X^i - \check{X}^i$.

In this example, the machine learning model 218 is configured to reduce the compression error by reprocessing $\check{X}^i$. Thus, the lossy decompressed data $\check{X}^i$ and the metadata 210 $S^i$ are input to the machine learning model 218. The output of the machine learning model 218 is an improved chunk signal $(\overline{X}^i = \overline{X}_1^i, \overline{X}_2^i, \ldots, \overline{X}_n^i)$. If the machine learning model 218 is trained sufficiently, the distance between $X^i$ and $\overline{X}^i$ is smaller than the compression error $X^i - \check{X}^i$. Thus, the compression error is reduced in the decompressed data.

The machine learning model 218, which may be a neural network, is trained in one example using a training set of input and output vectors. The input is a vector that is a concatenation of the vectors $\check{X}^i$ and $S^i$, whose dimension is n+nsax. The output of the machine learning model 218 is a vector $\overline{X}^i$, whose dimension is n.

To generate a training dataset, a number of raw samples from the sensor or device are obtained. The device, for example, may have a working mode that is configured to send data in an uncompressed form. Alternatively, these samples can be generated prior to operation of the device. The machine learning model can be trained in a supervised manner because the ground truth is available from the raw data.

The raw samples $(X = X_1, X_2, \ldots, X_{nraw})$ are separated into a training data set and a testing data set. For each sample in the training data set, a chunk is constructed $(X = X_i, X_{i+1}, \ldots, X_{i+n})$. Next, the metadata is constructed or generated $(S_i)$. Generating the training data set is performed at the gateway such that the device is not affected. During the training, the results of the trained machine learning model can be tested using the testing data set. If the machine learning model cannot correctly predict the residue values, the machine learning model may be discarded and the decompressed samples are used.

More specifically during training, the raw data is compressed, metadata is generated and the resulting vector is input to the model. The output can be compared to the original raw data to generate an error that may be used to train the model. This allows the model to be trained to reconstruct data from lossy compressed data.

Figure 3:
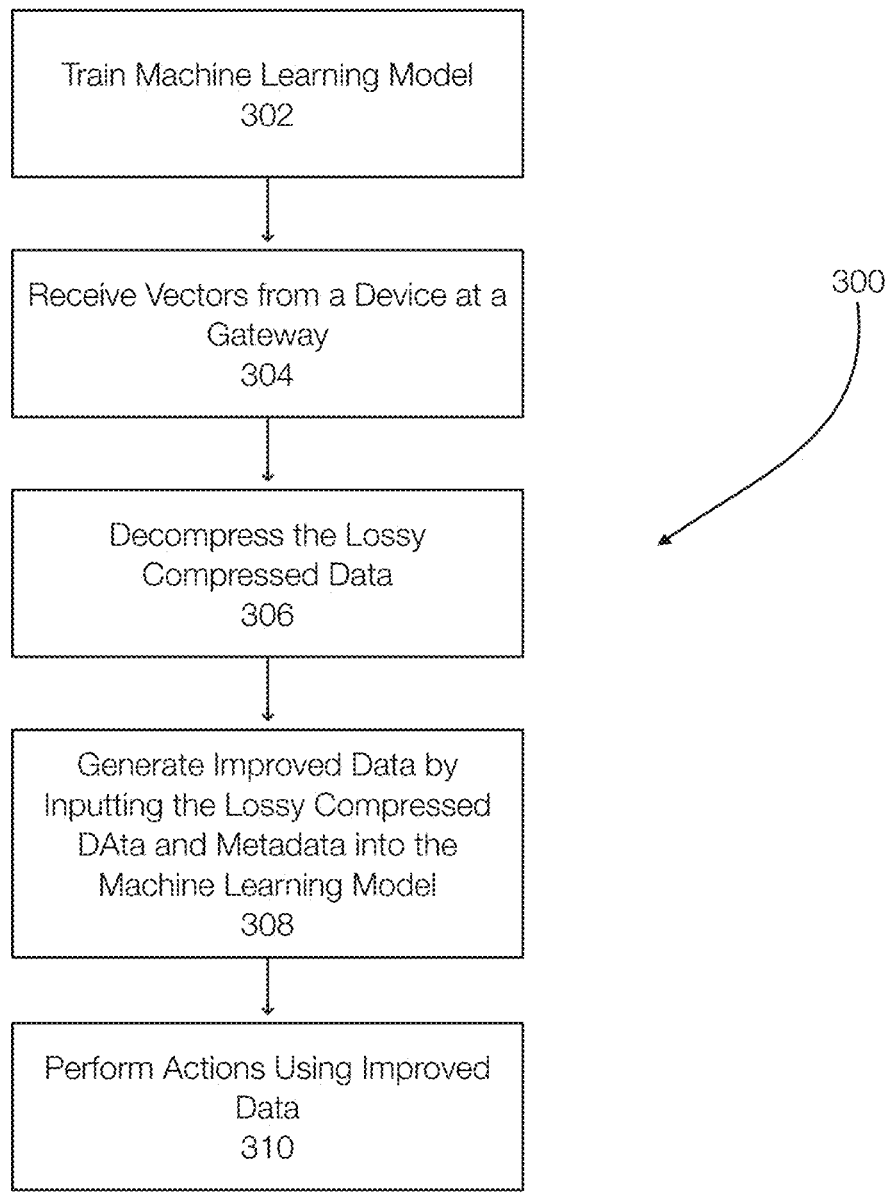
FIG. 3 discloses aspects of a method for reconstructing lossy compressed data to reduce compression errors.

FIG. 3 discloses aspects of reconstructing data received from a device such as a sensor or other IoT device. The method 300 includes steps or acts that can be performed independently of each other and at various timings. Some of the steps or acts may be preparatory in nature while others may be related to execution. For example, the method 300 may include training 302 a machine learning model, such as a neural network. The model may be trained prior to deployment in preparation for operating. The model is trained using raw data obtained from one or more devices. A model may be created for each type of device, a family of devices, or the like. Training the model may also include retraining the model, updating the model, or the like.

Once the model is deployed to a gateway, the gateway may receive 304 data from one or more of the devices. The data received at the gateway includes vectors such as a metadata vector and a compressed data vector. After receiving the vectors, the compressed data is decompressed 306. Because the compression algorithm was lossy, the output of decompression is signal or data that has a compression error when compared to the original data.

An improved data or signal is generated 308 by inputting the vectors including the metadata vector and the decompressed data vector into a trained machine learning model. Thus, the model outputs an improved data vector or signal.

The output of the machine learning model may be used to perform actions 310 or other operations. Operations performed 310 in response to the data may be triggered or based on the output. For example, a machine may be placed in shutdown mode when excessive temperatures are detected. Alerts may be generated if the reconstructed data is outside of a normal or expected range. Other actions may be performed and may depend on the type of data, the type of device and the system in which the device is operating.

FIGS. 4A, 4B, and 4C discloses aspects of experimental results. FIG. 4A illustrates datasets 400. These data sets represent different classes of IoT time series. In these examples, 82% of the samples were used for training purposes and 18% were used for testing or validation purposes. Each dataset includes 4800 samples and was normalized to zero mean and unit variance.

To train the neural networks or machine learning models, the data was broken into blocks or chunks of 16 samples, which represents the parameter n. The parameter nsax, which represents the number of metadata (SAX) samples, was tested with nsax=16, 4, and 2 with respect to windows of size 1, 3, and 5. The machine learning model was an MPL network with 1 layer of 40 neurons and with ReLU as the activation function.

FIG. 4B discloses aspects of results achieved with a compression ratio of 10%. In the table 410, the PSNR (Peak Signal to Noise Ratio) Baseline column represents the PSNR metric obtained by compressing and decompressing the data without using the trained machine learning model. The PSNR No SAX column represents using the trained machine learning model without metadata as input. The other columns represent various combinations of window sizes and number of metadata (e.g., SAX) samples or values. FIG. 4C discloses aspects of results achieved with a compression ratio of 20% in a table 420.

In the tables 410 and 420, a higher PSNR value represents a better result (the compression error is reduced) compared to the baseline. The tables 410 and 420 suggests that the ability to reduce the compression error is related to the number of metadata bins. When the metadata is provided at a higher resolution (more bins), more information about the time series is provided to the model. If the resolution of the metadata is too low (e.g., not enough bins), the compression error may not improve.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. For example, any element(s) of any embodiment may be combined with any element(s) of any other embodiment, to define still further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect(s) or solution(s). Finally, it is not required that any embodiment implement any of the advantageous and unexpected effects disclosed herein.

The following is a discussion of aspects of example operating environments for various embodiments of the invention. This discussion is not intended to limit the scope of the invention, or the applicability of the embodiments, in any way.

In general, embodiments of the invention may be implemented in connection with systems, software, and components, that individually and/or collectively implement, and/or cause the implementation of, compression operations, decompression operations, metadata operations, binning operations, chunking operations, reconstruction operations, error reducing operations, machine learning operations, or the like. More generally, the scope of the invention embraces any operating environment in which the disclosed concepts may be useful.

New and/or modified data collected and/or generated in connection with some embodiments, may be stored in a data protection environment that may take the form of a public or private cloud storage environment, an on-premises storage environment, and hybrid storage environments that include public and private elements. Any of these example storage environments, may be partly, or completely, virtualized. The storage environment may comprise, or consist of, a datacenter which is operable to service read, write, delete, backup, restore, and/or cloning, operations initiated by one or more clients or other elements of the operating environment. Where a backup comprises groups of data with different respective characteristics, that data may be allocated, and stored, to different respective targets in the storage environment, where the targets each correspond to a data group having one or more particular characteristics.

Example cloud computing environments, which may or may not be public, include storage environments that may provide data protection functionality for one or more clients. Another example of a cloud computing environment is one in which processing, data protection, compression/decompression/reconstruction and other, services may be performed on behalf of one or more clients. Some example cloud computing environments in connection with which embodiments of the invention may be employed include, but are not limited to, Microsoft Azure, Amazon AWS, Dell EMC Cloud Storage Services, and Google Cloud. More generally however, the scope of the invention is not limited to employment of any particular type or implementation of cloud computing environment.

In addition to the cloud environment, the operating environment may also include one or more clients that are capable of collecting, modifying, and creating, data. As such, a particular client may employ, or otherwise be associated with, one or more instances of each of one or more applications that perform such operations with respect to data. Such clients may comprise physical machines, containers, or virtual machines (VMs).

Particularly, devices in the operating environment may take the form of software, physical machines, containers, or VMs, or any combination of these, though no particular device implementation or configuration is required for any embodiment. Similarly, data system components such as databases, storage servers, storage volumes (LUNs), storage disks, replication services, backup servers, restore servers, backup clients, and restore clients, for example, may likewise take the form of software, physical machines, containers or virtual machines (VM), though no particular component implementation is required for any embodiment.

Example embodiments of the invention are applicable to any system capable of storing and handling various types of data or objects, in analog, digital, or other form. The principles of the disclosure are not limited to any particular form of representing and storing data or other information. Rather, such principles are equally applicable to any object capable of representing information.

It is noted that any operation(s) of any of the methods disclosed herein may be performed in response to, as a result of, and/or, based upon, the performance of any preceding operation(s). Correspondingly, performance of one or more operations, for example, may be a predicate or trigger to subsequent performance of one or more additional operations. Thus, for example, the various operations that may make up a method may be linked together or otherwise associated with each other by way of relations such as the examples just noted. Finally, and while it is not required, the individual operations that make up the various example methods disclosed herein are, in some embodiments, performed in the specific sequence recited in those examples. In other embodiments, the individual operations that make up a disclosed method may be performed in a sequence other than the specific sequence recited.

Following are some further example embodiments of the invention. These are presented only by way of example and are not intended to limit the scope of the invention in any way.

Embodiment 1. A method comprising: receiving a package from a device at a gateway, the package including compressed data and metadata values, wherein the metadata values allow patterns in original data corresponding to the compressed data to be found without looking at the original data, decompressing the compressed data to generate lossy decompressed data, and inputting the lossy decompressed data and the metadata values into a machine learning model that is trained to reduce a compression error associated with the lossy decompressed data, wherein the machine learning model outputs improved decompressed data.

Embodiment 2. The method of embodiment 1, wherein original data at the device is compressed to generate the compressed data.

Embodiment 3. The method of embodiment 1 and/or 2, further comprising setting a number of bins for the metadata values, wherein the number of bins relates to a number of symbols used to symbolically represent the original data.

Embodiment 4. The method of embodiment 1, 2, and/or 3, wherein the compressed data is received in chunks at the gateway.

Embodiment 5. The method of embodiment 1, 2, 3, and/or 4, further comprising training the machine learning model, wherein the machine learning model comprises a neural network.

Embodiment 6. The method of embodiment 1, 2, 3, 4, and/or 5, further comprising performing an action based on the improved decompressed data.

Embodiment 7. The method of embodiment 1, 2, 3, 4, 5, and/or 6, wherein the metadata is compressed at the device.

Embodiment 8. The method of embodiment 1, 2, 3, 4, 5, 6, and/or 7, wherein a distance between the improved decompressed data and original data generated at the device data is less than a distance between the decompressed data and the original data.

Embodiment 9. The method of embodiment 1, 2, 3, 4, 5, 6, 7, and/or 8, further comprising selecting a compression operation based on power consumption at the device.

Embodiment 10. The method of embodiment 1, 2, 3, 4, 5, 6, 7, 8, and/or 9, wherein an improvement in the improved decompressed data is determined by comparing a peak signal-to-noise-ratio of the improved decompressed signal to a baseline peak signal-to-noise-ratio.

Embodiment 11. A system, comprising hardware and/or software, operable to perform any of the operations, methods, or processes, or any portion of any of these, disclosed herein.

Embodiment 12 A non-transitory storage medium having stored therein instructions that are executable by one or more hardware processors to perform operations comprising the operations of any one or more of embodiments 1-10.

Embodiment 13. A method for performing any of the operations, methods, or processes, or any portion of any of these, disclosed herein.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which, when executed, cause a general purpose computer, special purpose computer, or special purpose processing device to perform a certain function or group of functions. As such, some embodiments of the invention may be downloadable to one or more systems or devices, for example, from a website, mesh topology, or other source. As well, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term module, component, agent, engine, service, may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

With reference briefly now to FIG. 5, any one or more of the entities disclosed, or implied, the Figures, and/or elsewhere herein, may take the form of, or include, or be implemented on, or hosted by, a physical computing device, one example of which is denoted at 500. As well, where any of the aforementioned elements comprise or consist of a virtual machine (VM), that VM may constitute a virtualization of any combination of the physical components disclosed in FIG. 5.

In the example of FIG. 5, the physical computing device 500 includes a memory 502 which may include one, some, or all, of random access memory (RAM), non-volatile memory (NVM) 504 such as NVRAM for example, read-only memory (ROM), and persistent memory, one or more hardware processors 506, non-transitory storage media 508, UI device 510, and data storage 512. One or more of the memory components 502 of the physical computing device 500 may take the form of solid state device (SSD) storage. As well, one or more applications 514 may be provided that comprise instructions executable by one or more hardware processors 506 to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud computing site, client, datacenter, data protection site including a cloud storage site, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   receiving a package from a device at a gateway, the package including compressed data and metadata values, wherein the metadata values allow patterns in original data corresponding to the compressed data to be found without looking at the original data;
   decompressing the compressed data to generate lossy decompressed data; and
   inputting the lossy decompressed data and the metadata values into a machine learning model that is trained to reduce a compression error associated with the lossy decompressed data, wherein the machine learning model outputs improved decompressed data.

2. The method of claim 1, wherein original data at the device is compressed to generate the compressed data.

3. The method of claim 1, further comprising setting a number of bins for the metadata values, wherein the number of bins relates to a number of symbols used to symbolically represent the original data.

4. The method of claim 1, wherein the compressed data is received in chunks at the gateway.

5. The method of claim 1, further comprising training the machine learning model, wherein the machine learning model comprises a neural network.

6. The method of claim 1, further comprising performing an action based on the improved decompressed data.

7. The method of claim 1, wherein the metadata is compressed at the device.

8. The method of claim 1, wherein a distance between the improved decompressed data and original data generated at the device data is less than a distance between the decompressed data and the original data.

9. The method of claim 1, further comprising selecting a compression operation based on power consumption at the device.

10. The method of claim 1, wherein an improvement in the improved decompressed data is determined by comparing a peak signal-to-noise-ratio of the improved decompressed signal to a baseline peak signal-to-noise-ratio.

11. A non-transitory storage medium having stored therein instructions that are executable by one or more hardware processors to perform operations comprising:
    receiving a package from a device at a gateway, the package including compressed data and metadata values, wherein the metadata values allow patterns in original data corresponding to the compressed data to be found without looking at the original data;
    decompressing the compressed data to generate lossy decompressed data; and
    inputting the lossy decompressed data and the metadata values into a machine learning model that is trained to reduce a compression error associated with the lossy decompressed data, wherein the machine learning model outputs improved decompressed data.

12. The non-transitory storage medium of claim 11, wherein original data at the device is compressed to generate the compressed data.

13. The non-transitory storage medium of claim 11, further comprising setting a number of bins for the metadata values, wherein the number of bins relates to a number of symbols used to symbolically represent the original data.

14. The non-transitory storage medium of claim 11, wherein the compressed data is received in chunks at the gateway.

15. The non-transitory storage medium of claim 11, further comprising training the machine learning model, wherein the machine learning model comprises a neural network.

16. The non-transitory storage medium of claim 11, further comprising performing an action based on the improved decompressed data.

17. The non-transitory storage medium of claim 11, wherein the metadata is compressed at the device.

18. The non-transitory storage medium of claim 11, wherein a distance between the improved decompressed data and original data generated at the device data is less than a distance between the decompressed data and the original data.

19. The non-transitory storage medium of claim 11, further comprising selecting a compression operation based on power consumption at the device.

20. The non-transitory storage medium of claim 11, wherein an improvement in the improved decompressed data is determined by comparing a peak signal-to-noise-ratio of the improved decompressed signal to a baseline peak signal-to-noise-ratio.

* * * * *